(12) United States Patent
Shim et al.

(10) Patent No.: US 11,424,085 B2
(45) Date of Patent: Aug. 23, 2022

(54) CONNECTOR AND DISPLAY DEVICE INCLUDING THE SAME

(71) Applicant: SAMSUNG DISPLAY CO., LTD., Yongin-si (KR)

(72) Inventors: Jong Min Shim, Hwaseong-si (KR); Min Young Park, Busan (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 158 days.

(21) Appl. No.: 16/914,636

(22) Filed: Jun. 29, 2020

(65) Prior Publication Data
US 2021/0166891 A1  Jun. 3, 2021

(30) Foreign Application Priority Data

Nov. 28, 2019  (KR) .................. 10-2019-0155880

(51) Int. Cl.
*H05K 1/18* (2006.01)
*H01H 1/20* (2006.01)
(Continued)

(52) U.S. Cl.
CPC .......... *H01H 1/2041* (2013.01); *H01H 1/365* (2013.01); *H05K 1/18* (2013.01);
(Continued)

(58) Field of Classification Search
CPC .... H05K 1/18; H05K 1/181–188; H05K 5/00; H05K 5/0017; H01H 1/20; H01H 1/2041; H01H 1/365; H01H 1/403; H01R 12/55; H01R 12/62; H01R 12/65; H01R 12/70; H01R 12/79; G06F 1/16; G06F 1/1677
(Continued)

(56) References Cited

U.S. PATENT DOCUMENTS 7,359,217 B2 * 4/2008 Pan ..................... H04M 1/0216
361/752
7,993,151 B2 * 8/2011 Chuo .................... H01R 12/88
439/260

(Continued)

FOREIGN PATENT DOCUMENTS

KR  10-2010-0048200  5/2010
KR  10-2017-0064011  6/2017
(Continued)

*Primary Examiner* — Tuan T Dinh
(74) *Attorney, Agent, or Firm* — F. Chau & Associates, LLC

(57) ABSTRACT

According to an exemplary embodiment, a display device comprises: a display panel configured to include a plurality of pixels; a printed circuit board connected to the display panel; a connector mounted in the printed circuit board; and a cable fastened to the connector, wherein the connector comprises: a first connector mounted in the printed circuit board to include a first voltage pad, a second voltage pad, and a plurality of signal pads disposed between the first voltage pad and the second voltage pad; a hinge engaged with the first connector; and a second connector for rotation with respect to a hinge shaft, the second connector includes a third voltage pad and a fourth voltage pad, wherein the cable is inserted between the first connector and the second connector.

11 Claims, 7 Drawing Sheets

(51) Int. Cl.
*H05K 5/00* (2006.01)
*H01H 1/36* (2006.01)

(52) U.S. Cl.
CPC . *H05K 5/0017* (2013.01); *H05K 2201/10053* (2013.01); *H05K 2201/10128* (2013.01); *H05K 2201/10189* (2013.01)

(58) Field of Classification Search
USPC ............... 361/749–750, 767, 775–780, 803; 174/250–254; 349/149–151
See application file for complete search history.

(56) References Cited

U.S. PATENT DOCUMENTS

| | | | |
|---|---|---|---|
| 8,634,183 B2* | 1/2014 | Wikander | G06F 1/1681 361/679.01 |
| 10,440,840 B2* | 10/2019 | Ochi | H01L 51/5237 |
| 2007/0042627 A1* | 2/2007 | Hyun | H01R 13/62988 439/260 |
| 2013/0058048 A1* | 3/2013 | Choi | G06F 1/1681 361/727 |

FOREIGN PATENT DOCUMENTS

| KR | 10-2019-0027259 | 3/2019 |
|---|---|---|
| KR | 10-2020-0039086 | 4/2020 |

* cited by examiner

CONNECTOR AND DISPLAY DEVICE INCLUDING THE SAME

CROSS-REFERENCE TO RELATED APPLICATIONS

This patent application claims priority under 35 U.S.C. § 119 to Korean Patent Application No. 10-2019-0155880 filed on Nov. 28, 2019, the disclosure of which is incorporated by reference herein in its entirety.

TECHNICAL FIELD

Exemplary embodiments of the present inventive concept relate to a connector and a display device including the same.

DISCUSSION OF THE RELATED ART

A display device includes a display panel on which an image is displayed, and components for driving the same. The components for driving the display panel may be mounted on a plurality of printed circuit boards. The printed circuit boards may be connected to each other through a cable such as a flexible flat cable (FFC). The cable may be electrically connected to a circuit pattern formed on the printed circuit board through a connector mounted on the printed circuit board.

Recently, the resolution and driving frequency of a display device have improved, and a display device has more functions installed than before. Accordingly, the amount of data or control signals to be transmitted and received between the display panel and its components are increasing, and the number of cables and connectors for transmitting and receiving the increased amount of data and control signals is also increasing. An increase in the number of cables and connectors may cause an increase in weight and price of the display device.

The above information disclosed in this section is only for the enhancement of understanding of the background of the present invention and therefore the above information disclosed should not form the prior art that is already known to a person of ordinary skill in the art.

SUMMARY

An organic light emitting diode display may display a desired luminance by applying a first power voltage to an anode electrode of the organic light emitting diode, applying a second power voltage to the cathode electrode, and controlling an amount of current flowing through the first power voltage to the organic light emitting diode. A current path with a high allowable current for both the first power voltage and the second power voltage is needed.

In a conventional connector, the allowable current per pad is about 0.5 A, whereas the first power voltage and the second power voltage require an allowable current of about 30 A. Widths of some pads of the connector may be extended for the first power voltage and the second power voltage requiring high allowable current. In this case, the number of pads required for signal transmission in a limited space of the connector is reduced. When the number of pads for signal transmission in one connector is reduced, the number of cables and connectors included in the display device should increase.

On the other hand, when widths of wires of the cable for the transmission of the first power voltage and the second power voltage is not sufficiently large, the cable may melt due to heat generated from the wires.

Exemplary embodiments of the inventive concept can provide a connector capable of increasing an allowable current and a display device including the same.

An exemplary embodiment of the inventive concept provides a display device comprising: a display panel having a plurality of pixels; a printed circuit board connected to the display panel; a connector mounted in the printed circuit board; and a cable fastened to the connector, wherein the connector comprises: a first connector mounted in the printed circuit board to include a first voltage pad, a second voltage pad, and a plurality of signal pads disposed between the first voltage pad and the second voltage pad; a hinge engaged with the first connector; and a second connector for rotation with respect to a hinge shaft, the second connector includes a third voltage pad and a fourth voltage pad, wherein the cable is inserted between the first connector and the second connector.

The cable may comprise: a base substrate; a plurality of signal wires disposed on a first surface of the base substrate positioned and configured to make contact with the signal pads; a first voltage wire disposed on a second surface of the base substrate positioned and configured to make contact with the third voltage pad; and a second voltage wire disposed on the second surface of the base substrate positioned and configured to make contact with the fourth voltage pad.

The first voltage wire may transfer a first power supply voltage having a high voltage level applied to the pixels, and the second voltage wire may transfer a second power voltage having a low voltage level applied to the pixels.

The signal wires may transmit an image data signal and a driving control signal for generating a data voltage applied to the plurality of pixels.

The hinge may comprise: the hinge shaft; a first switching unit engaged with the hinge shaft at a position overlapping the first voltage pad; and a second switching unit engaged with the hinge shaft at a position overlapping the second voltage pad.

The first switching unit may include a first switching pad connected to the third voltage pad, and the first switching pad may be configured to make contact with the first voltage pad depending on a rotational position of the second connector.

The second switching unit may include a second switching pad connected to the fourth voltage pad, and the second switching pad may be configured to make contact with the second voltage pad depending on a rotational position of the second connector.

When the second connector is rotated with respect to the hinge shaft to be in a closed state to face the first connector, the first switching pad may be in contact with the first voltage pad and the second switching pad may be in contact with the second voltage pad.

When the second connector is rotated with respect to the hinge shaft to be in an open state and spaced apart from the first connector by a predetermined angle or more, the first switching pad may be separated from the first voltage pad and the second switching pad may be separated from the second voltage pad.

Widths of the third voltage pad and the fourth voltage pad may be greater than that of one of the signal pads, and allowable currents of the third voltage pad and the fourth voltage pad may be greater than that of one of the signal pads.

The third voltage pad and the fourth voltage pad may be disposed on a surface facing the first connector.

An exemplary embodiment of the inventive concept provides a connector comprising: a first connector; a hinge engaged with the first connector; and a second connector for rotation with respect to a hinge shaft, wherein the first connector includes a first voltage pad, a second voltage pad, and a plurality of signal pads disposed between the first voltage pad and the second voltage pad, the second connector includes a third voltage pad and a fourth voltage pad, wherein a cable is inserted between the first connector and the second connector.

The hinge may comprise: the hinge shaft; a first switching unit engaged with the hinge shaft at a position overlapping the first voltage pad; and a second switching unit engaged with the hinge shaft at a position overlapping the second voltage pad.

The first switching unit may comprise a first switching pad connected to the third voltage pad, and the first switching pad may be configured to make contact with the first voltage pad depending on a rotational position of the second connector.

The second switching unit may comprise a second switching pad connected to the fourth voltage pad, and the second switching pad may be configured to make contact with the second voltage pad depending on a rotational position of the second connector.

The first switching unit and the second switching unit may have a cylindrical shape having a radius that is larger than that of the hinge shaft.

The first switching pad may be disposed on a portion of a curved surface of the first switching unit, and the second switching pad may be disposed on a portion of a curved surface of the second switching unit.

When the second connector is rotated with respect to the hinge shaft to be in a closed state to face the first connector, the first switching pad may be in contact with the first voltage pad and the second switching pad may be in contact with the second voltage pad.

When the second connector is rotated with respect to the hinge shaft to be in an open state and spaced apart from the first connector by a predetermined angle or more, the first switching pad may be separated from the first voltage pad and the second switching pad may be separated from the second voltage pad.

The third voltage pad may overlap one group of the signal pads, and the fourth voltage pad may overlap another group of the signal pads.

Widths of the third voltage pad and the fourth voltage pad may be greater than that of one of the signal pads, and allowable currents of the third voltage pad and the fourth voltage pad may be greater than that of one of the signal pads.

The third voltage pad and the fourth voltage pad may be disposed on a surface facing the first connector.

In an exemplary embodiment, the allowable current of the connector may increase, thereby reducing the number of connectors and cables needed in the display device.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
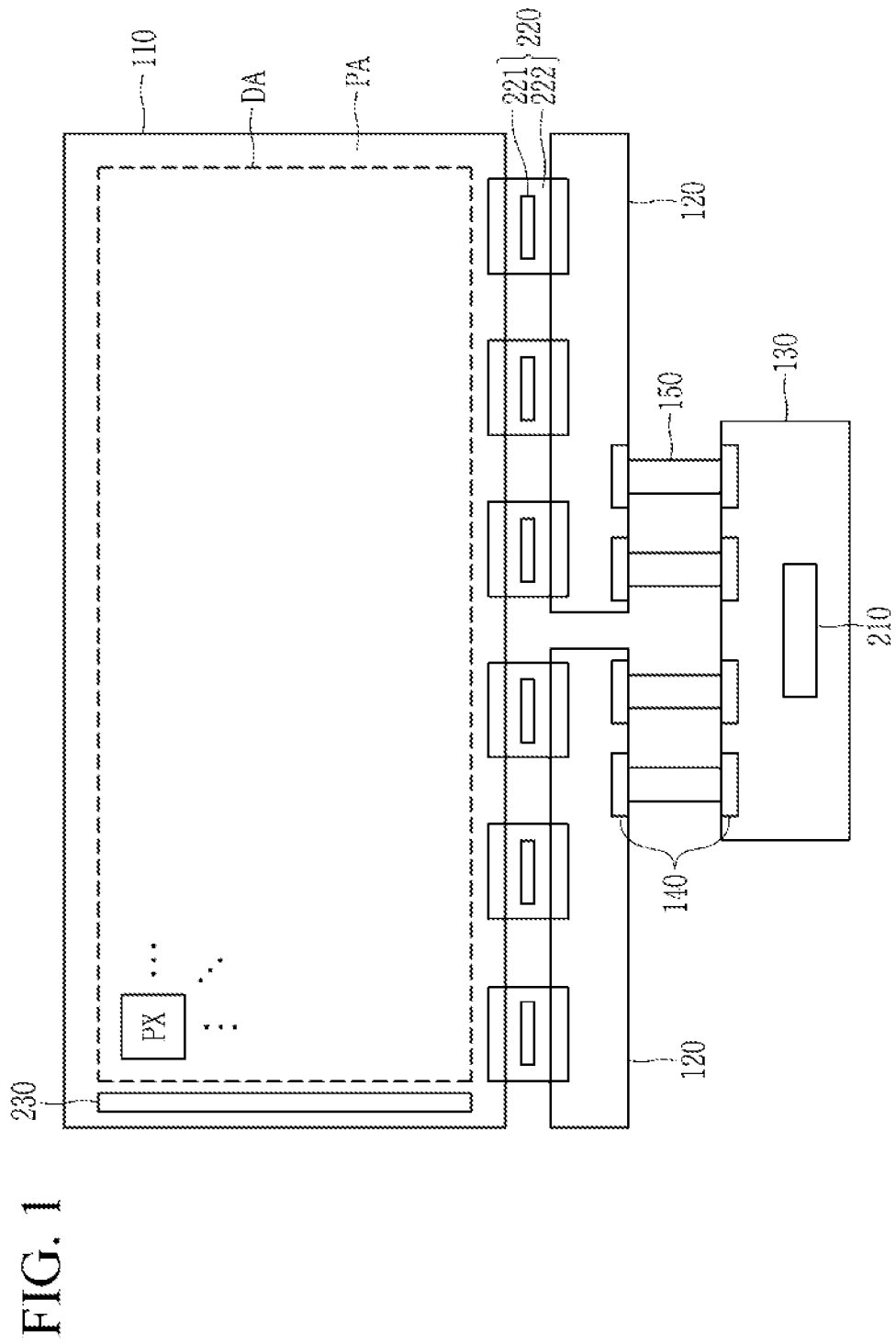
FIG. 1 illustrates a schematic top plan view of a display device according to an exemplary embodiment of the inventive concept.

Embodiments of the present invention will be described in more detail hereinafter with reference to the accompanying drawings, in which exemplary embodiments of the inventive concept are shown. It will be understood by one of ordinary skill in the art that variations in form and detail may be made therein without departing from the spirit and scope of the inventive concept as defined by the following claims.

Further, in the various exemplary embodiments of the inventive concept, for components having the same configuration, the use of similar or identical reference numbers in the various drawings is intended to indicate the presence of a similar or identical element or feature. For example, for components having different configurations in two embodiments and each embodiment is illustrated by a separate drawing, different reference numbers may be used in the two drawings.

To clearly describe the inventive concept, parts that are irrelevant to the description are omitted, and like reference numerals may refer to like elements or components throughout the specification and accompanying drawings.

Further, sizes and thicknesses of components shown in the accompanying drawings are given for better understanding and convenience of description. These drawings are not, however, to scale and may not precisely reflect the precise structural or performance characteristics of any given embodiment, and should not be interpreted as defining or limiting the range of values or properties encompassed by exemplary embodiments. In the drawings, the relative thicknesses and positioning of layers, films, panels, regions, etc., may be reduced or exaggerated for clarity.

It will be understood that when a component such as a layer, film, region, or substrate is referred to as being "on" another component, it can be directly on the other component or intervening components may be present. In contrast, when an element is referred to as being "directly on" another element, there are no intervening components present. Further, the word "over" or "on" means positioning on or below the object portion, and does not necessarily mean positioning on the upper side of the object portion based on a gravity direction. Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below. Other words used to describe the relationship between elements should be interpreted in a like fashion.

In addition, throughout the specification, unless explicitly described to the contrary, the word "comprise" and variations such as "comprises" or "comprising" will be understood to imply the inclusion of stated elements but not the exclusion of any other elements (e.g., in addition to including the stated elements, a device, process, or method may also include other elements).

FIG. 1 illustrates a schematic top plan view of a display device according to an exemplary embodiment of the inventive concept.

Referring to FIG. 1, the display device includes a display panel 110, a first printed circuit board 120, a second printed circuit board 130, a connector 140, a cable 150, and a driving circuit unit 220.

The display panel 110 includes a display area DA and a peripheral area PA. The peripheral area PA may be an area surrounding the display area DA. The display area DA may include a plurality of pixels PX, and a plurality of gate lines and a plurality of data lines connected with the pixels PX. The pixels PX may be arranged in a row direction and a column direction. The gate lines may generally extend in the row direction to be connected to the pixels PX. The data lines may generally extend in the column direction to be connected to the pixels PX.

The display panel 110 may include a gate driver 230. The gate driver 230 may be disposed along one edge of the display area DA and connected to the gate lines. The gate driver 230 may sequentially apply the gate signal of the gate-on voltage to the gate lines. The gate driver 230 may be integrated and disposed in the display panel 110. According to an exemplary embodiment, the gate driver 230 may be formed of an IC, and may be mounted in the display panel 110 by a chip-on-glass (COG) method, a chip-on-film (COF) method, or the like.

The first printed circuit board 120 is disposed around the display panel 110. The first printed circuit board 120 may be connected to the display panel 110 through the driving circuit unit 220. The first printed circuit board 120 may be connected to the second printed circuit board 130 through the connector 140 and the cable 150. The cable 150 may be a flexible flat cable (FFC). The connector 140 may be mounted in at least one of the first printed circuit board 120 and the second printed circuit board 130. The cable 150 may be fastened to the connector 140, and may be connected to the first printed circuit board 120 and the second printed circuit board 130 through the connector 140.

A signal controller 210 may be disposed in the second printed circuit board 130. The signal controller 210 receives an image signal and an input control signal transmitted from the outside. The signal controller 210 generates an image data signal and a driving control signal depending on the image signal and the input control signal. A power supply for supplying a voltage for driving the display panel 110 may be disposed in the second printed circuit board 130. The power supply may be provided separately from the signal controller 210, or may be included in the signal controller 210.

The first printed circuit board 120 receives a voltage, an image data signal, and a driving control signal for driving the display panel 110 from the second printed circuit board 130 through the connector 140 and the cable 150.

The voltage for driving the display panel 110 includes a power voltage and a driving voltage. The power voltage is a voltage applied to the pixels PX, and is a voltage related to the luminance of the pixels PX. The power voltage may include a first power voltage and a second power voltage. The first power voltage may be a high level voltage, and the second power voltage may be a low level voltage. The first power voltage may be a voltage of substantially about 20 V to about 30 V. The second power voltage may be a negative voltage of substantially lower than 0 V or equal to 0 V. The driving voltage is a voltage applied to the data driver 221 and the gate driver 230, and is a logic voltage for operations of the data driver 221 and the gate driver 230. The driving voltage may be a voltage of substantially about 0 V to about 3 V.

The driving circuit unit 220 may include a data driver 221 and a flexible printed circuit board 222. The data driver 221 may be connected to the data lines. The data driver 221 receives an image data signal and a driving control signal from the signal controller 210. The data driver 221 may sample and hold the image data signal depending on the driving control signal, and may apply a data voltage to the data lines. The data driver 221 may be mounted in the flexible printed circuit board 222 by a chip-on-film (COF) method. A first end of the flexible printed circuit board 222 may be connected to the peripheral area PA of the display panel 110. A second end of the flexible printed circuit board 222 may be connected to the first printed circuit board 120. According to an exemplary embodiment of the inventive concept, the data driver 221 may be mounted in the peripheral area PA of the display panel 110 in a chip-on-glass (COG) manner.

The driving control signal and the driving voltage may be transmitted to the gate driver 230 through the flexible printed circuit board 222.

Hereinafter, the connector 140 will be described in more detail with reference to FIG. 2, and the cable 150 will be described in more detail with reference to FIG. 3.

Figure 2:
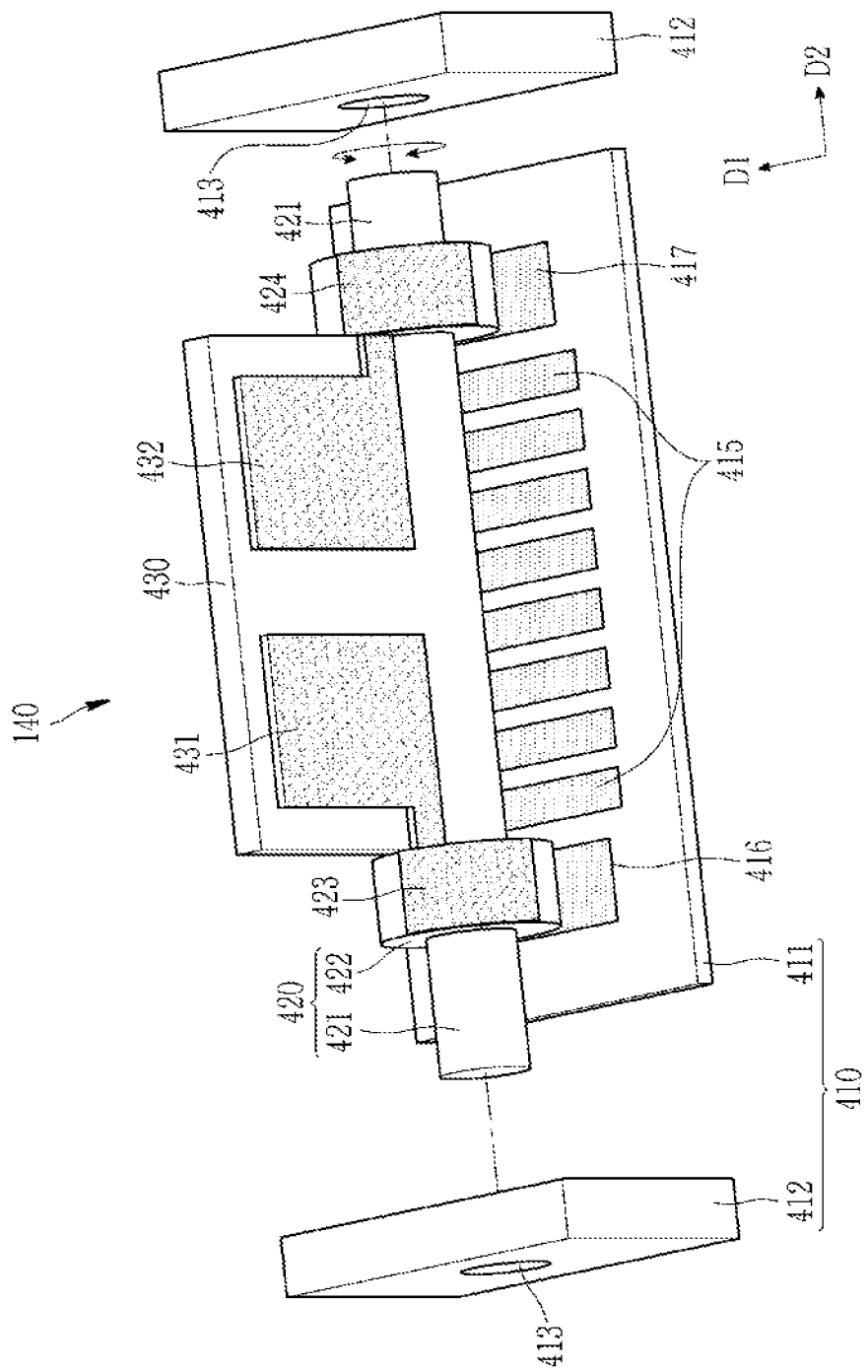
FIG. 2 illustrates a perspective view of a connector according to an exemplary embodiment of the inventive concept.

FIG. 2 illustrates a perspective view of a connector according to an exemplary embodiment of the inventive concept.

Referring to FIG. 2, the connector 140 includes a first connector 410, a hinge 420, and a second connector 430.

The first connector 410 includes a pad unit 411 and a hinge coupler 412. The first connector 410 may be mounted on at least one of the first printed circuit board 120 and the second printed circuit board 130. Hereinafter, the printed circuit board indicates at least one of the first printed circuit board 120 and the second printed circuit board 130.

The pad unit 411 is mounted on the printed circuit boards 120 and 130. A plurality of signal pads 415, a first voltage pad 416, and a second voltage pad 417 are disposed on the pad unit 411. The signal pads 415, the first voltage pad 416, and the second voltage pad 417 may be made of a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof The signal pads 415 are disposed between the first voltage pad 416 and the second voltage pad 417. The signal pads 415 may be formed to elongate in a first direction D1. The signal pads 415 may be arranged in a second direction D2 between the first voltage pad 416 and the second voltage pad 417. The first direction D1 may correspond to a direction in which the cable 150 is inserted or a longitudinal direction of the cable 150. The second direction D2 may be perpendicular to the first direction D1. Widths of the first voltage pad 416 and the second voltage pad 417 may be greater than that of the signal pads 415. Herein, the width indicates a length in the second direction D2.

The signal pads 415, the first voltage pad 416, and the second voltage pad 417 may be electrically connected to circuit patterns formed on the printed circuit boards 120 and 130.

The hinge coupler 412 is disposed on the opposite side of the pad unit 411 to engage with the hinge 420. In FIG. 2, the hinge coupler 412 is separated from the pad unit 411 for convenience of description. The hinge coupler 412 may include a hole 413 for engaging with the hinge 420.

The hinge 420 is engaged with the first connector 410. The hinge 420 includes a hinge shaft 421 and a switching unit 422.

The hinge shaft 421 may extend in the second direction D2 to be engaged with the hinge coupler 412 on the opposite side of the pad unit 411. The hinge shaft 421 may be inserted into the hole 413 of the hinge coupler 412 on the opposite side. The hinge shaft 421 may function as a rotation shaft of the second connector 430.

The switching unit 422 is disposed on the opposite side of the hinge shaft 421. The switching unit 422 may be engaged with the hinge shaft 421 in the form of a cylinder having a larger radius than that of the hinge shaft 421. A central axis of the cylinder of the switching unit 422 may coincide with the hinge shaft 421. The switching unit 422 may include a first switching unit engaged with the hinge shaft 421 (e.g., at left of the hinge shaft 421) at a position overlapping the first voltage pad 416, and a second switching unit engaged with the hinge shaft 421 (e.g., at right of the hinge shaft 421) at a position overlapping the second voltage pad 417. In an exemplary embodiment, the first switching unit and the second switching unit may be of a cylindrical shape having a radius that is larger than that of the hinge shaft 421. The first switching unit may include a first switching pad 423 disposed on a curved surface of the first switching unit, and the second switching unit may include a second switching pad 424 disposed on a curved surface of the second switching unit. The first switching pad 423 and the second switching pad 424 may be respectively disposed on portions of the curved surfaces of the switching units 422. Each of the first switching pad 423 and the second switching pad 424 may be located at a portion that is greater than 90 degrees and less than 180 degrees from the curved surface of 360 degrees with respect to the hinge shaft 421 of the switching unit 422. The first switching pad 423 may be configured to make contact with the first voltage pad 416 and the second switching pad 424 may be configured to make contact with the second voltage pad 417 depending on the rotational position of the second connector 430. The first switching pad 423 and the second switch pad 424 may include a metal or a metal alloy.

The cable 150 may be inserted between the switching units 422 on opposite sides. The switching unit 422 may perform a function of aligning the position of the cable 150 such that the cable 150 is inserted into a predetermined position.

The second connector 430 may be engaged with the hinge 420 for rotation with respect to the hinge shaft 421. The second connector 430 may include a third voltage pad 431 and a fourth voltage pad 432 disposed on a surface facing the first connector 410 by rotating with respect to the hinge shaft 421. The third voltage pad 431 and the fourth voltage pad 432 may include a metal or a metal alloy.

The third voltage pad 431 is connected with the first switching pad 423, and the fourth voltage pad 432 is connected with the second switching pad 424. For example, the first switching pad 423 may be connected to the third voltage pad 431, and the first switching pad 423 may be configured to make contact with the first voltage pad 416 depending on a rotational position of the second connector 430. In another example, the second switching pad 424 may be connected to the fourth voltage pad 432, and the second switching pad 424 may be configured to make contact with the second voltage pad 417 depending on a rotational position of the second connector 430. The third voltage pad 431 may overlap one group of the signal pads 415, and the fourth voltage pad 432 may overlap another group of the signal pads 415. Widths of the third voltage pad 431 and the fourth voltage pad 432 may be greater than that of the signal pads 415. Accordingly, the allowable current of the third voltage pad 431 and the allowable current of the fourth voltage pad 432 may be greater than the allowable current of the signal pads 415. Widths of the third voltage pad 431 and the fourth voltage pad 432 may be greater than those of the first voltage pad 416 and the second voltage pad 417. According to an exemplary embodiment of the inventive concept, the widths of the third voltage pad 431 and the fourth voltage pad 432 may be equal to those of the first voltage pad 416 and the second voltage pad 417.

When the connector 140 is in a closed state, the first switching pad 423 is in contact with the first voltage pad 416 and the second switching pad 424 is in contact with the second voltage pad 417. The closed state of the connector 140 is a state in which the second connector 430 is rotated with respect to the hinge shaft 421 to face the first connector 410.

When the connector 140 is in an open state, the first switching pad 423 is separated from the first voltage pad 416, and the second switch pad 424 is separated from the second voltage pad 417. For example, the first switching pad 423 does not contact the first voltage pad 416, and the second switch pad 424 does not contact the second voltage pad 417. The open state of the connector 140 is a state in which the second connector 430 is rotated with respect to the hinge shaft 421 and spaced apart from the first connector 410 by a predetermined angle or more.

Figure 3:
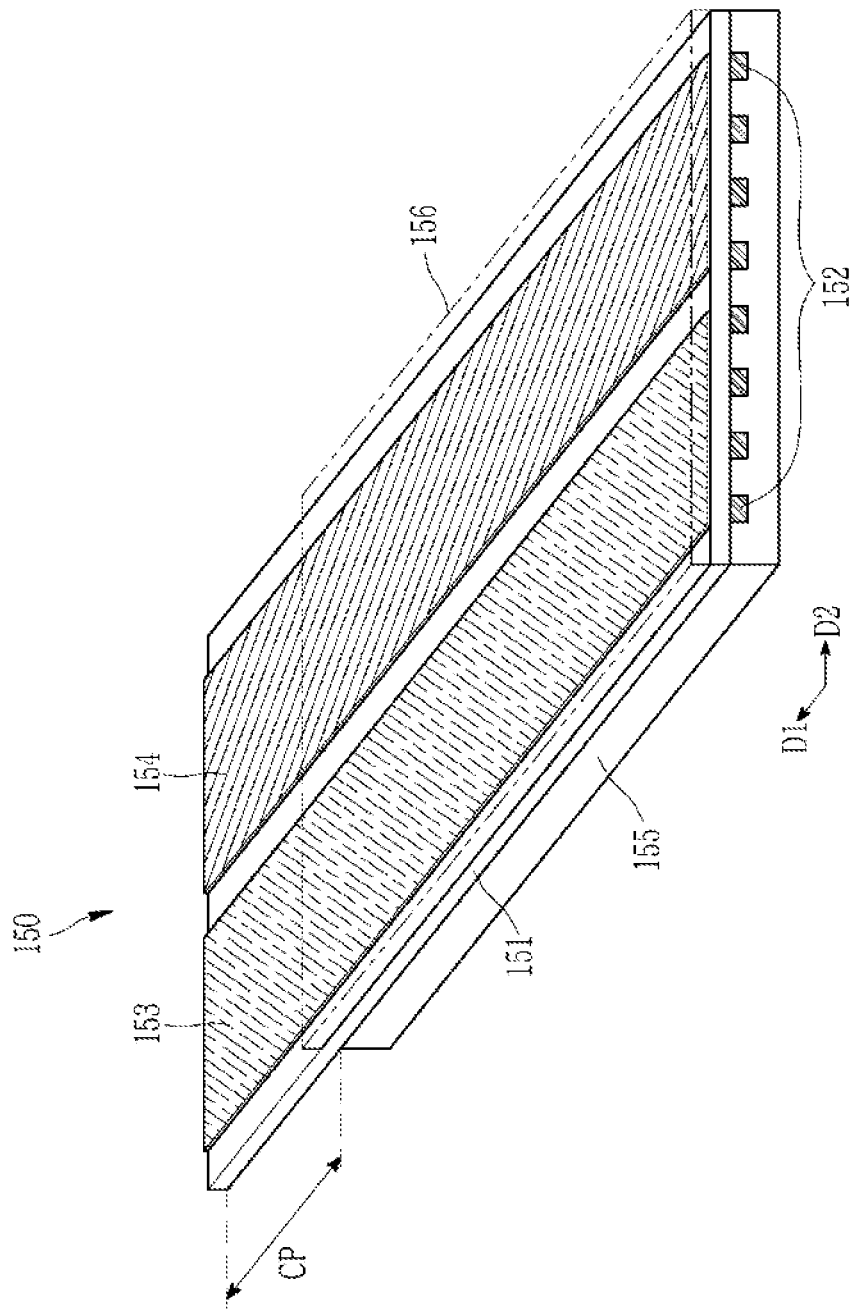
FIG. 3 illustrates a perspective view of a cable according to an exemplary embodiment of the present invention.

FIG. 3 illustrates a perspective view of a cable according to an exemplary embodiment of the inventive concept.

Referring to FIG. 3, the cable 150 includes a base substrate 151, a plurality of signal wires 152, a first voltage wire 153, a second voltage wire 154, a first insulating layer 155, and a second insulating layer 156.

The base substrate 151 may be made of a flexible insulating material. The base substrate 151 may comprise an insulating film.

The signal wires 152 are disposed on a first surface of the base substrate 151. The signal wires 152 may extend in parallel in a same direction in which the base substrate 151 extends. For example, the signal wires 152 may be disposed on the first (e.g., lower) surface of the base substrate 151, and may extend in the first direction D1, which is in an extension direction of the cable 150. In one embodiment, the signal wires 152 disposed on a first surface of the base substrate 151 positioned and configured to make contact with the signal pads 415. The signal wires 152 may comprise wires for transferring a driving voltage, an image data signal, and a driving control signal. In an exemplary embodiment, the signal wires 152 transmit an image data signal and a driving control signal for generating a data voltage applied to the pixels PX.

The first voltage wire 153 and the second voltage wire 154 are disposed on a second (e.g., upper) surface of the base substrate 151. The second surface of the base substrate 151 is opposite to the first surface of the base substrate 151. The first voltage wire 153 and the second voltage wire 154 may extend in parallel in a same direction in which the base substrate 151 extends. The first voltage wire 153 and the second voltage wire 154 may be disposed on the upper surface of the base substrate 151, and may extend in the first direction Dl. In one embodiment, the second voltage wire 154 disposed on the second surface of the base substrate 151 may be positioned and configured to make contact with the fourth voltage pad 432. The first voltage wire 153 may comprise wires for transferring the first power voltage, and the second voltage wire 154 may comprise wires for transferring the second power voltage. In an exemplary embodiment of the inventive concept, the first voltage wire 153 may transfer a first power supply voltage having a high voltage level applied to the pixels PX whereas the second voltage wire 154 may transfer a second power voltage having a low voltage level applied to the pixels PX.

The signal wires 152, the first voltage wire 153, and the second voltage wire 154 may include a metal or a metal alloy. Widths of the first voltage wire 153 and the second voltage wire 154 are greater than that of the signal wires 152. Accordingly, allowable currents of the first voltage wire 153 and the second voltage wire 154 may be greater than that of the signal wires 152.

According to an exemplary embodiment of the inventive concept, a plurality of signal wires 152 disposed on the first surface of the base substrate 151 may be in contact with the signal pads 415. The first voltage wire 153 disposed on the second surface of the base substrate 151 may be in contact with the third voltage pad 431. The second voltage wire 154 disposed on the second surface of the base substrate 151 may be in contact with the fourth voltage pad 432.

The first insulating layer 155 may cover the signal wires 152 to protect the signal wires 152 from the outside environment. The second insulating layer 156 may cover the first voltage wire 153 and the second voltage wire 154 to protect the first voltage wire 153 and the second voltage wire 154 from the outside environment.

At a connection part CP of the cable 150, the first insulating layer 155 does not cover the signal wires 152, and the second insulating layer 156 does not cover the first voltage wire 153 and the second voltage wire 154. The connection part CP of the cable 150 may be an end region of the cable 150. The signal wires 152, the first voltage wire 153, and the second voltage wire 154 are exposed (e.g., not protected from outside environment) at the connection part CP of the cable 150.

The cable 150 is inserted between the first connector 410 and the second connector 430. The connection part CP of the cable 150 is disposed between the first connector 410 and the second connector 430. The signal wires 152, the first voltage wire 153, and the second voltage wire 154 may be electrically connected to the connector 140 in the connection part CP.

Hereinafter, a connection relationship between the connector 140 and the cable 150 will be described with reference to FIG. 4 to FIG. 6.

Figure 4:
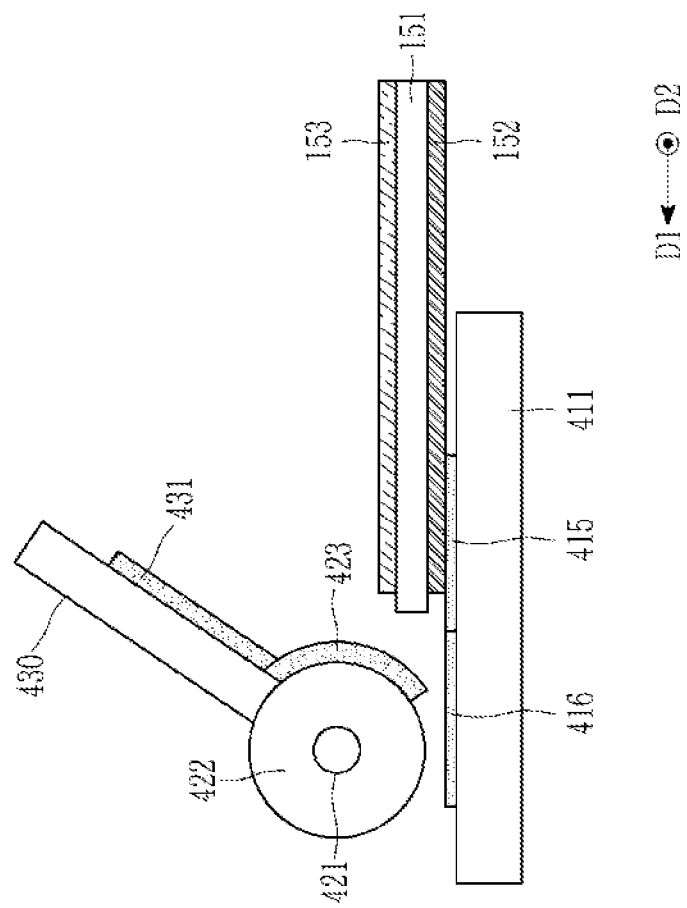
FIG. 4 to FIG. 6 illustrate side views for describing a connection relationship between a connector and a cable according to an exemplary embodiment of the inventive concept.
Figure 5:
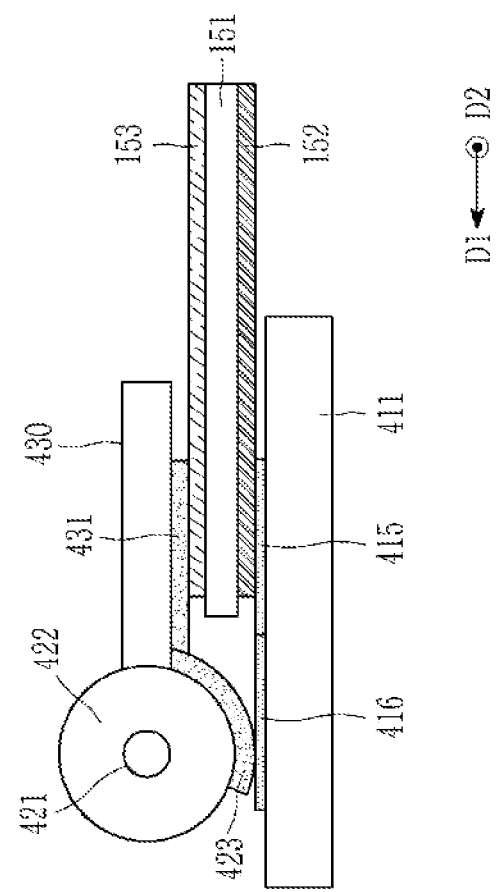
Figure 6:
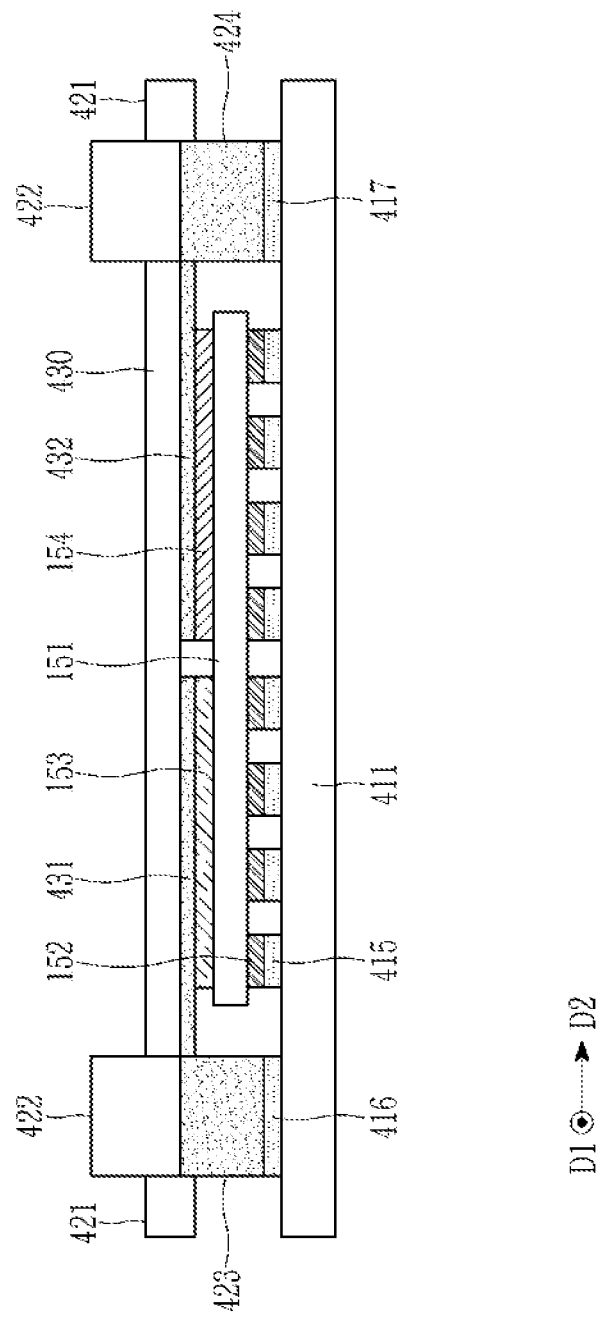

FIG. 4 to FIG. 6 illustrate side views for describing a connection relationship between a connector and a cable according to an exemplary embodiment of the inventive concept.

FIG. 4 illustrates an open state of the connector 140, FIG. 5 illustrates a closed state of the connector 140, and FIG. 6 illustrates a state in which voltage and signal wires of the cable 150 and voltage pads of the connector 140 are electrically connected when the connector 140 is closed.

As illustrated in FIG. 4, the second connector 430 is rotated with respect to the hinge shaft 421 to be in an open state and spaced apart from the pad unit 411 of the first connector 410 by a predetermined angle or more.

When the connector 140 is in the open state, the third voltage pad 431 is not in contact with the first voltage wire 153 of the cable 150, and the first switching pad 423 is separated from the first voltage pad 416. The first switching pad 423 does not contact the first voltage pad 416. Similarly, the fourth voltage pad 432 is not in contact with the second voltage wire 154 of the cable 150, and the second switching pad 424 is separated from the second voltage pad 417. The second switching pad 424 is not in contact with the second voltage pad 417. For example, the first voltage wire 153 and the second voltage wire 154 of the cable 150 are electrically separated from the connector 140. The first voltage wire 153 and second voltage wire 154 of the cable 150 are electrically separated from the circuit patterns of the printed circuit boards 120 and 130.

As illustrated in FIG. 5 and FIG. 6, the second connector 430 is rotated with respect to the hinge shaft 421 to be in a closed state of facing the first connector 140.

When the connector 140 is closed, the third voltage pad 431 is in contact with the first voltage wire 153 of the cable 150, and the first switching pad 423 is in contact with the first voltage pad 416. Similarly, the fourth voltage pad 432 is in contact with the second voltage wire 154 of the cable 150, and the second switching pad 424 is in contact with the second voltage pad 417. For example, the first voltage wire 153 of the cable 150 may be electrically connected to the first voltage pad 416 through the third voltage pad 431 and the first switching pad 423. In another example, the second voltage wire 154 of the cable 150 may be electrically connected to the second voltage pad 417 through the fourth voltage pad 432 and the second switching pad 424. The first voltage wire 153 may be electrically connected to the circuit patterns of the printed circuit boards 120 and 130 through the first voltage pad 416. The second voltage wire 154 may be electrically connected to the circuit patterns of the printed circuit boards 120 and 130 through the second voltage pad 417.

In addition, the signal wires 152 of the cable 150 make contact with the signal pads 415. The signal wires 152 may be electrically connected to the circuit patterns of the printed circuit boards 120 and 130 through the signal pads 415.

As described above, the signal wires 152 are disposed on the first surface (e.g., lower surface) of the cable 150, and the first voltage wire 153 and the second voltage wire 154 are widely disposed on the second surface (e.g., upper surface) of the cable 150, and thus the cable 150 may be prevented from melting due to heat generation of the wires. In addition, as the third voltage pad 431 and the fourth voltage pad 432 making contact with the first voltage wire 153 and the second voltage wire 154 have wide widths, the allowable current of the connector 140 may be increased. Accordingly, the number of connectors 140 and cables 150 included in the display device may be reduced.

Figure 7:
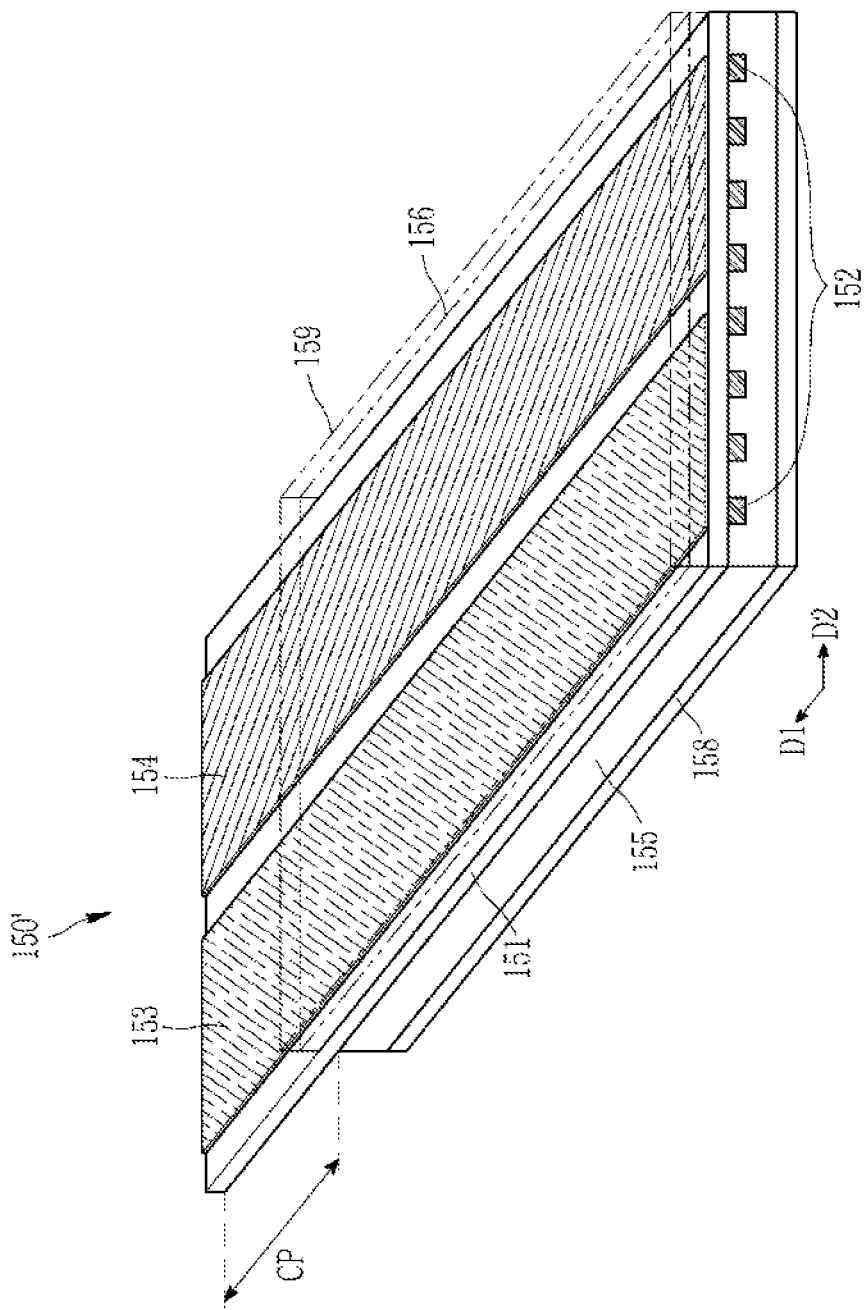
FIG. 7 illustrates a perspective view of a cable according to another exemplary embodiment of the inventive concept.

FIG. 7 illustrates a perspective view of a cable according to another exemplary embodiment of the inventive concept.

Compared with the cable 150 illustrated in FIG. 3, a cable 150' may further include a first shielding layer 158 and a second shielding layer 159 made of a metal or a metal alloy.

The first shielding layer 158 may be disposed on the first insulating layer 155 to block external electrical influences. The first shielding layer 158 may cover the signal wires 152 and prevent undesired noise from occurring in the image data signal and the driving control signal transmitted through the signal wires 152.

The second shielding layer 159 may be disposed on the second insulating layer 156 to block external electrical influences. The second shielding layer 159 may cover the first voltage wire 153 and the second voltage wire 154 and prevent undesired noise from occurring in the first power voltage and the second power voltage transferred through the first voltage wire 153 and the second voltage wire 154.

According to an exemplary embodiment of the inventive concept, the first shielding layer 158 and the second shielding layer 159 do not cover the signal wires 152, the first voltage wire 153, or the second voltage wire 154 at the connection part CP of the cable 150.

In an exemplary embodiment, either one of the first shielding layer 158 or the second shielding layer 159 may be omitted.

While exemplary embodiments of the inventive concept have been particularly shown and described with reference to the accompanying drawings and exemplary embodiments thereof, the specific terms used herein are only for the purpose of describing the present invention and are not intended to define the meanings thereof or limit the scope of the invention set forth in the following claims. Therefore, it will be understood by one of ordinary skill in the art that variations in form and detail may be made therein without departing from the spirit and scope of the inventive concept as defined by the following claims.

What is claimed is:

1. A display device, comprising:
   a display panel having a plurality of pixels;
   a printed circuit board connected to the display panel;
   a connector mounted in the printed circuit board; and
   a cable fastened to the connector,
   wherein the connector comprises:
   a first connector mounted in the printed circuit board to include a first voltage pad, a second voltage pad, and a plurality of signal pads disposed between the first voltage pad and the second voltage pad;
   a hinge engaged with the first connector; and
   a second connector for rotation with respect to a hinge shaft, the second connector includes a third voltage pad and a fourth voltage pad, wherein
   the cable is inserted between the first connector and the second connector.

2. The display device of claim 1, wherein
   the cable comprises:
   a base substrate;
   a plurality of signal wires disposed on a first surface of the base substrate positioned and configured to make contact with the signal pads;
   a first voltage wire disposed on a second surface of the base substrate positioned and configured to make contact with the third voltage pad; and
   a second voltage wire disposed on the second surface of the base substrate positioned and configured to make contact with the fourth voltage pad.

3. The display device of claim 2, wherein
   the first voltage wire transfers a first power supply voltage having a high voltage level applied to the pixels, and
   the second voltage wire transfers a second power voltage having a low voltage level applied to the pixels.

4. The display device of claim 3, wherein
   the signal wires transmit an image data signal and a driving control signal for generating a data voltage applied to the plurality of pixels.

5. The display device of claim 1, wherein
   the hinge comprises:
   the hinge shaft;
   a first switching unit engaged with the hinge shaft at a position overlapping the first voltage pad; and
   a second switching unit engaged with the hinge shaft at a position overlapping the second voltage pad.

6. The display device of claim 5, wherein
   the first switching unit includes a first switching pad connected to the third voltage pad, and the first switching pad is configured to make contact with the first voltage pad depending on a rotational position of the second connector.

7. The display device of claim 6, wherein
   the second switching unit includes a second switching pad connected to the fourth voltage pad, and the second switching pad is configured to make contact with the second voltage pad depending on a rotational position of the second connector.

8. The display device of claim 7, wherein
   when the second connector is rotated with respect to the hinge shaft to be in a closed state to face the first connector, the first switching pad is in contact with the first voltage pad and the second switching pad is in contact with the second voltage pad.

9. The display device of claim 8, wherein
   when the second connector is rotated with respect to the hinge shaft to be in an open state and spaced apart from the first connector by a predetermined angle or more, the first switching pad is separated from the first voltage pad and the second switching pad is separated from the second voltage pad.

10. The display device of claim 1, wherein
    widths of the third voltage pad and the fourth voltage pad are greater than that of one of the signal pads.

11. The display device of claim 1, wherein
    the third voltage pad and the fourth voltage pad are disposed on a surface facing the first connector.

* * * * *